US008039131B2

(12) United States Patent
Cohen et al.

(10) Patent No.: US 8,039,131 B2
(45) Date of Patent: Oct. 18, 2011

(54) CLASS OF PURE PIEZOELECTRIC MATERIALS

(75) Inventors: Ronald Cohen, Washington, DC (US); Panchapakesan Ganesh, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 111 days.

(21) Appl. No.: 12/401,935

(22) Filed: Mar. 11, 2009

(65) Prior Publication Data

US 2009/0291324 A1 Nov. 26, 2009

Related U.S. Application Data

(60) Provisional application No. 61/064,550, filed on Mar. 11, 2008.

(51) Int. Cl.
*C01G 23/00* (2006.01)
*B32B 9/00* (2006.01)

(52) U.S. Cl. ..................... 428/701; 423/598

(58) Field of Classification Search ............ None
See application file for complete search history.

(56) References Cited

U.S. PATENT DOCUMENTS 3,962,146 A * 6/1976 Matsuoka et al. ...... 252/519.12
2006/0079050 A1* 4/2006 Cahalen et al. ............. 438/250
2006/0288928 A1* 12/2006 Eom et al. ..................... 117/89
2008/0006795 A1* 1/2008 Khatua et al. ................ 252/500
2008/0006796 A1* 1/2008 Khatua et al. ................ 252/500
2008/0009572 A1* 1/2008 Khatua et al. ................ 524/160
2008/0009578 A1* 1/2008 Khatua et al. ................ 524/431

OTHER PUBLICATIONS

Das et al. 2002, Kluwer Academic Publishers, p. 239-247.*
Zhigang. Wu and R. E. Cohen, Pressure-Induced Anomolous Phase Transitions and Colossal Enhancement of Piezoelectricity in PbTiO3, Phys. Rev. Lett., 95, 37601 (2005).
Muhetaer Ahart, Maddury Somayazulu, R. E. Cohen, P. Ganesh, Przmeyslaw Dera,Ho-Kwang Mao, Russell J. Hemley, Yang Ren, Peter Liermann and Zhigang Wu, Origin of Morphotropic phase boundaries in ferroelectrics, Nature 451, 06459 (2008).
X. Gonze et.al., First-principles computation of material properties: the ABINIT software project, Comput. Mater. Sci. 25, 478 (2002).
Muhtar Ahart et al., Origin of morphotropic phase boudaries in ferroelectrics, vol. 451/31, Jan. 2008.
Sonalee Chopra et al., Sol-gel preparation and characterization of calcium modified lead titanate (PCT) thin films, Ceramics International 30 (2004) 1477-1481.
Tomoaki Karaki et al., Electrical Properties of Epitaxial (Pb, Sr) TiO3 Thin Films Prepared by RF Magnetron Sputtering, Japanese Society of Applied Physics No. 118, Nov. 2002.
International Search Report and Written Opinion dated Sep. 8, 2009.

* cited by examiner

*Primary Examiner* — Timothy Speer
*Assistant Examiner* — Vera Katz
(74) *Attorney, Agent, or Firm* — Morgan Lewis & Bockius LLP

(57) ABSTRACT

A modification of $PbTiO_3$ perovskite wherein at least part of Pb is replaced by a smaller atom with a similar ionic charge.

6 Claims, 3 Drawing Sheets

ROCK-SALT PATTERN FOR $Pb_{1/2}Ge_{1/2}TiO_3$ AND $Sn_{1/2}Ge_{1/2}TiO_3$
(OXYGEN ATOMS AT FACE CENTERS NOT SHOWN)

CLASS OF PURE PIEZOELECTRIC MATERIALS

CROSS REFERENCE TO RELATED APPLICATIONS

This application claims the benefit of U.S. Provisional Application No. 61/064,550, filed Mar. 11, 2008, which is incorporated herein by reference in its entirety.

STATEMENT REGARDING FEDERALLY SPONSORED RESEARCH

This invention was made with U.S. Government support under grant N0001-4-01-1-0365 from the Office of Naval Research. The U.S. Government has certain rights in the invention.

FIELD OF THE INVENTION

The present invention relates to a novel class of piezoelectric and ferroelectric materials.

BACKGROUND OF THE INVENTION

Lead-zirconate-titanate (PZT)-based ceramics have been the primary material used in piezoelectric devices over the past several decades, especially in piezoelectric devices such as ultrasound medical probes, hydrophones and sonar for underwater imaging and communications, multi-layer actuators for fuel injection, piezoelectric printers etc. To enhance the piezoelectric properties of PZT ceramics, compositions near a phase transition are chosen.

In this regard, single crystals of solid solutions of lead-zinc-niobate and lead-titanate (PZN-PT) and of lead magnesium-niobate and lead-titanate (PMN-PT) are promising new materials. Compared to the conventional state-of-the-art PZT ceramics, PZN-PT and PMN-PT single crystals have significantly large electromechanical coupling (conversion of energy from electrical to mechanical and vice-versa) due to the much higher values of piezoelectric coefficients (about 4-5 times that of PZT), to offer advantages over the older standards.

Notwithstanding the advantages offered by newer piezoelectric materials such as PZN-PT and PMN-PT, there remains a desire to have further new piezoelectric materials with unique and advantageous characteristics, e.g. materials with piezoelectric coefficients which are significantly higher than those obtained with currently available materials.

SUMMARY OF THE INVENTION

The invention contemplates a novel class of piezoelectrics and ferroelectrics based on the use of chemical pressure to shift the high-pressure extremely high coupling transition recently found in PbTiO$_3$, to lower pressures. A particularly preferred compound within this group is Pb$_{1/2}$Sn$_{1/2}$TiO$_3$ (referred to elsewhere herein for convenience as PSnT). This new compound is considered to have giant piezoelectric coefficients, significantly higher than any currently known materials.

The class of ferroelectric and piezoelectric materials constituting the present invention is based on the concept of applying "chemical pressure" to tune (shift) the morphotropic phase boundary of pure PbTiO$_3$ [1,2] to lower pressures. Application of "chemical pressure" was performed by substituting the 'A' site of PbTiO$_3$ perovskite by smaller atoms with similar ionic charge, e.g. Sn, Ge or the like. Examples of the compounds thus obtainable are Pb$_{1/2}$Sn$_{1/2}$TiO$_3$, Pb$_{1/2}$Ge$_{1/2}$TiO$_3$ and Sn$_{1/2}$Ge$_{1/2}$TiO$_3$. These compounds represent a class of materials having superior electromechanical properties compared to previously available piezoelectric materials (FIG. 1 and FIG. 2).

DETAILED DESCRIPTION OF THE INVENTION

Ab-initio simulations were performed using the LDA exchange-correlation functional with the ABINIT [3] package. The pseudopotential method was used to treat the core and the valence electrons. Full substitution of Pb by the smaller Sn atom to get SnTiO$_3$ gives a tetragonal ground state, with the rhombohedral phase at ~12.6 meV/at higher energy. Substitution of the 'A' site with only 50% of Sn to form layered compounds of Pb$_{1/2}$Sn$_{1/2}$TiO$_3$, resulted in a more promising material that has been previously reported in the recent Nature paper [2]. Local density approximation computations using ABINIT show that it has an orthorhombic ground state of symmetry Pmm2, (polarization along [x00], c/a=0.91) with an energy difference of 12 meV/at between Pmm2 and the next state Cm (polarization along [xxz], c/a=0.98) followed by tetragonal P4mm (polarization along [00z], c/a=1.12) with a ΔE of 3 meV/at. Strain differences $\epsilon_{33}-\epsilon_{11}$ are predictably equal to −0.10, −0.02 and 0.11 in the three phases respectively. The Polarization (P), as computed by the Berry's phase method, in the P4mm phase is (0, 0, 1.2) C/m$^2$ and in its ground State Pmm2 phase is (1.1, 0, 0) C/m$^2$. For comparison, PZT P4mm phase has P=(0, 0, 0.81) C/m$^2$. The large predicted polarization implies a large Curie temperature T$_c$.

Figure 1:
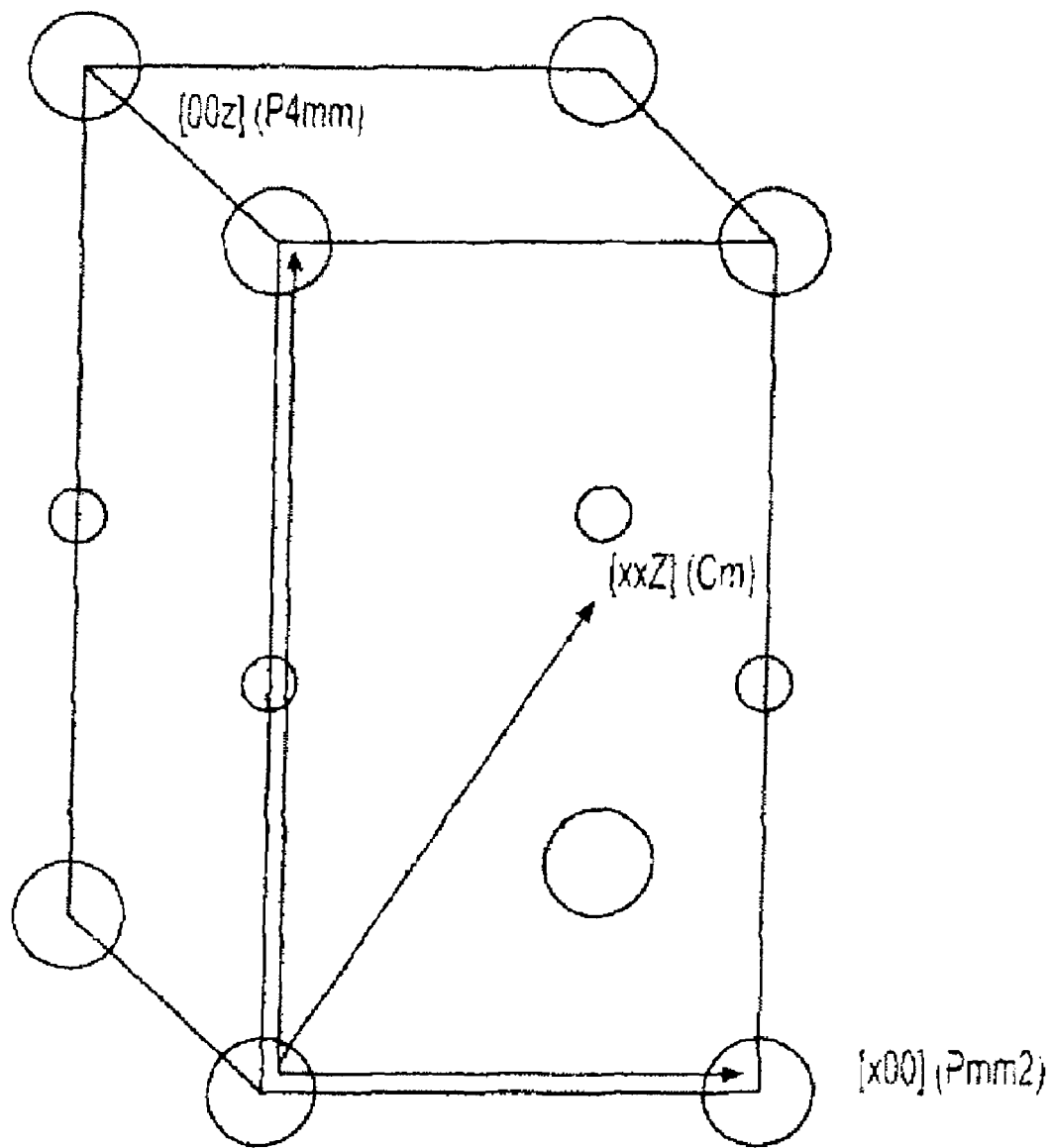
FIG. 1 illustrates the structure of Pb$_{1/2}$Sn$_{1/2}$TiO$_3$ (also referred to herein as PbSnT)
Figure 2:
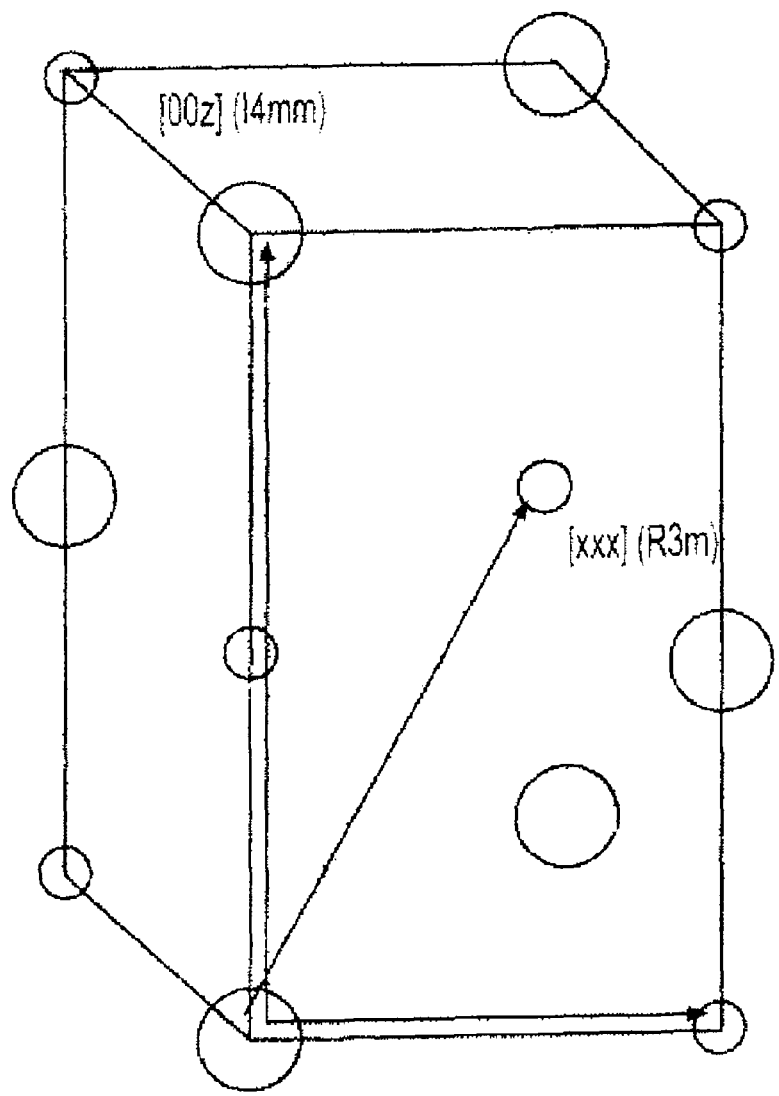
FIG. 2 illustrates the pattern of two other compounds according to the invention.
Figure 3:
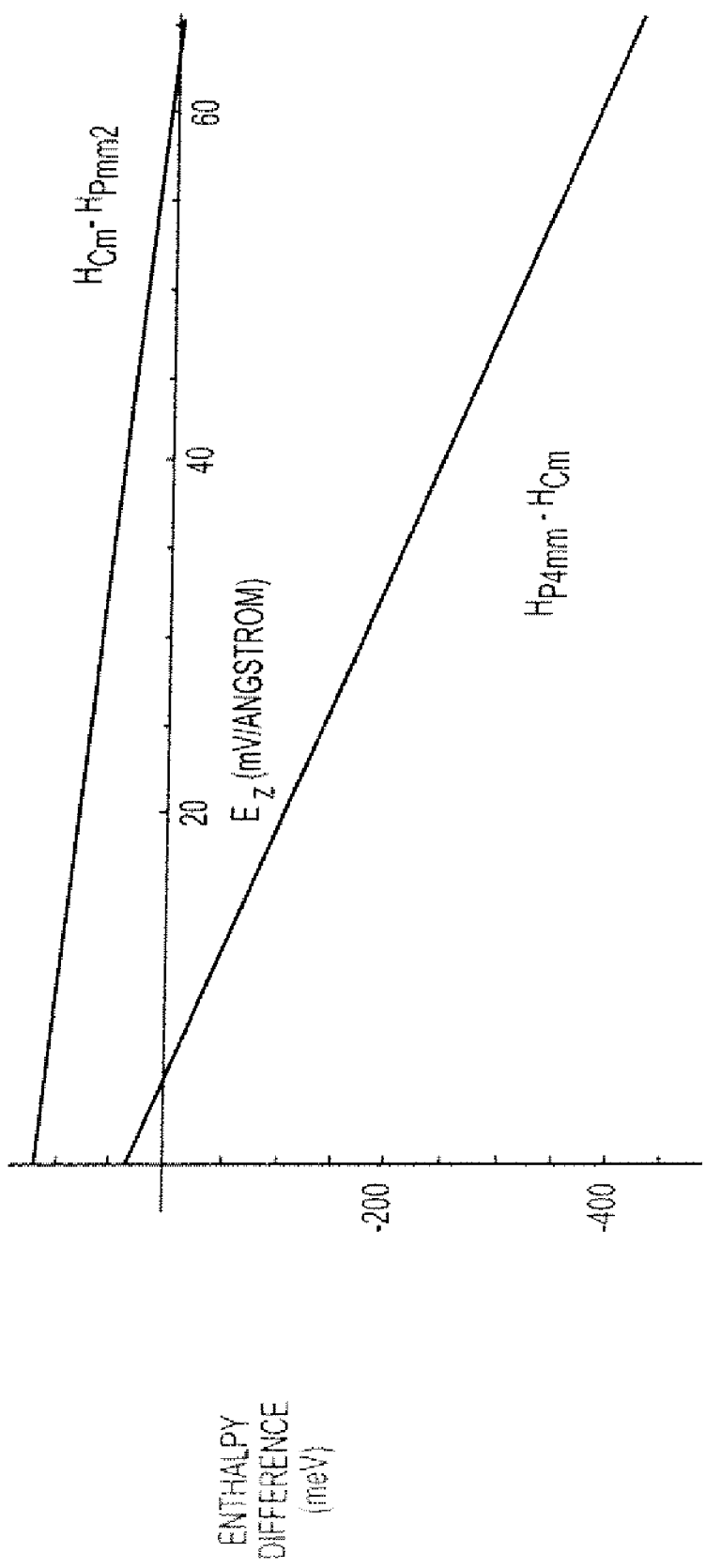
FIG. 3 illustrates the Electric Enthalpy difference (meV) versus E$_z$ (mV/Angstrom) between the phases of PSnT. The intersection with the zero axis shows the required field to rotate the polarization between the phases, The Cm to P4mm transition rotates the polarization and has a large strain, giving a giant electromechanical coupling d$_{33}$~2100 pC/N. The results show that this transition is highly non-linear.

The orthorhombic and the monoclinic phases are found to be dynamically stable. One can define an electric enthalpy H=U−P.E, where 'U' is the total energy and 'P' and 'E' are the polarization and electric field. FIG. 3 shows the enthalpy versus electric field along 'z' direction for the Cm phase with respect to the ground state and the P4mm phase with respect to the Cm phase. The zero crossing of the curves show that the critical field is very high to go from the Pmm2 phase to the Cm phase, but to rotate the polarization from the Cm to the P4mm phase one needs an electric field of only about ~500 kV/cm. Using the strain of P4mm and Cm phase one obtains a d$_{33}$~2100 pC/N. This is three times that of PZT-5H (largest component d$_{15}$~741 pC/N) and comparable to that of PZN-PT (largest component d$_{33}$~2000-3000 pC/N). It also shows a huge dielectric response (Table 2), with values close to that of PZT near its MPB composition. The large values of the polarization, dielectric constant and piezoelectric constants suggest that it may also have large non-linear optic coefficients.

The ground state of PSnT ordered along (001) is considered to be orthorhombic, and does not have giant piezoelectric coefficients. Rather the monoclinic Cm phase is believed to have giant coupling. The Cm phase is stabilized by growing PSnT epitaxially on SrTiO$_3$. In the monoclinic phase Pb$_{1/2}$Sn$_{1/2}$TiO$_3$ has a lattice parameter a~7.44 a.u., very close to the lattice parameter of SrTiO$_3$ (a~7.40 a.u), so that it can be grown epitaxially using conventional MBE methods over SrTiO$_3$ and make it the ground state.

Disorder in Pb and Sn may also stabilize a monoclinic or rhombohedral ground state. Accordingly, it is considered that conventional crystal growth would also yield extraordinary electromechanical materials.

In addition to Pb$_{1/2}$Sn$_{1/2}$TiO$_3$, Pb$_{1/2}$Ge$_{1/2}$TiO$_3$ and Sn$_{1/2}$Ge$_{1/2}$TiO$_3$ have been found to be promising new materials. Pb$_{1/2}$Ge$_{1/2}$TiO$_3$ and Sn$_{1/2}$Ge$_{1/2}$TiO$_3$ both have a rhombohedral ground state in the rock salt pattern (space group R3m) with the tetragonal phase (space group I4mm) higher up in energy by 10.1 meV/at and 17.7 meV/at respectively. Their polarizations in the P4mm phase are (0, 0, 1.3) C/m$^2$ and (0, 0, 1.5) C/m$^2$ respectively.

The exact values of the lattice constants, strain, polarization and piezoelectric coefficients are sensitive to the choice of exchange-correlation functional, plane wave cutoff and k-point grids used to integrate over the Brillouin zone. However, these changes will not negatively affect the superior electromechanical properties of the present materials, these properties being greater than those of presently used transducer materials. It is believed that the simplicity of the new compounds of the invention will lower costs, which in turn should expand the applicability of piezoelectric materials. The large values of the polarization, dielectric constant and piezoelectric constants seem to suggest its use in making non-linear optic devices as well.

The design of a pure compound with giant electromechanical coupling will have significant advantages over relaxor ferroelectric solid solutions which require close control of composition and are heterogeneous. It should be much easier, for example, to grow ordered homohogeneous films of PSnT than PZN-PT or PMN-PT. If instead even higher coupling is desired, that may be achieved by alloying PSnT with another component and engineering the composition, as is done with PZT.

It will be appreciated that there are many uses for the materials of the invention. For example, one application of thin films of PSnT grown on SrTiO$_3$ is the wings of artificial insects, which can be used for surveillance, monitoring of hazardous environments such as in reactors or other high radiation areas, or in toxic locations. Another use of the present materials is as micropumps in medical applications. Numerous other applications in MEMS exist. Bulk samples can be used as high performance piezoelectrics wherever PZT or relaxor ferroelectrics are currently used.

TABLE 1

The coordinates in the monoclinic phase for Pb$_{1/2}$Sn$_{1/2}$TiO$_3$ are as below:

| R$_1$ (a.u) | 7.447 | 0.066 | 0.014 |
| R$_2$ (a.u) | 0.066 | 7.447 | 0.014 |
| R$_3$ (a.u) | 0.028 | 0.028 | 14.538 |

TABLE 1-continued

The coordinates in the monoclinic phase for Pb$_{1/2}$Sn$_{1/2}$TiO$_3$ are as below:

| Reduced coordinates for: | | | |
| --- | --- | --- | --- |
| Pb | 0.031 | 0.031 | 0.014 |
| Sn | 0.080 | 0.080 | 0.516 |
| Ti1 | 0.526 | 0.526 | 0.255 |
| Ti2 | 0.523 | 0.523 | 0.755 |
| O1 | 0.477 | −0.013 | 0.248 |
| O2 | 0.465 | −0.015 | 0.742 |
| O3 | 0.480 | 0.480 | −0.001 |
| O4 | 0.465 | 0.465 | 0.500 |
| O5 | −0.013 | 0.477 | 0.248 |
| O6 | −0.015 | 0.465 | 0.742 |

TABLE 2

Dielectric constants for PSnT in the Cm phase:

| Direction | Dielectric constant |
| --- | --- |
| X | 651 |
| Y | 651 |
| Z | 238 |

The references cited above are more fully identified as follows:
1. Z. Wu and R. E. Cohen, Phys. Rev. Lett., 95, 37601 (2005)
2. Muhetaer Ahart and Maddury Somayazulu and R. E. Cohen and P. Ganesh and Przmeyslaw Dera and Ho-Kwang Mao and Russell J. Hemley and Yang Ren and Peter Liermann and Zhigang Wu, Nature 451, 06459 (2008)
3. X. Gonze et. al. Comput. Mater. Sci. 25, 478 (2002)

The contents of each of the above-listed references are incorporated herein in their entirety.

It will be appreciated that various modifications may be made in the invention as described above. Accordingly, the scope of the invention is set out in the following claims wherein:

The invention claimed is:

1. A compound selected from the group consisting of Pb$_{1/2}$Ge$_{1/2}$TiO$_3$ and Sn$_{1/2}$Ge$_{1/2}$TiO$_3$.

2. A thin film of the compound of claim 1, wherein the thin film is grown on a substrate.

3. The thin film of claim 2, wherein the substrate is SrTiO$_3$.

4. The compound of claim 1 wherein the compound is disordered, doped or alloyed.

5. A wing of an artificial insect comprising the thin film of claim 3.

6. A micropump comprising the compound of claim 1 or claim 4.

* * * * *